United States Patent
Yamada

(10) Patent No.: US 7,075,117 B2
(45) Date of Patent: Jul. 11, 2006

(54) OPTICAL SEMICONDUCTOR DEVICE

(75) Inventor: Koji Yamada, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/000,403

(22) Filed: Dec. 1, 2004

(65) Prior Publication Data

US 2005/0121687 A1   Jun. 9, 2005

(30) Foreign Application Priority Data

Dec. 4, 2003   (JP) ............................ 2003-405599

(51) Int. Cl.
*H01L 29/227* (2006.01)

(52) U.S. Cl. ............................ 257/98; 385/88; 385/91; 385/92; 385/93; 385/94

(58) Field of Classification Search ................... 257/98
See application file for complete search history.

(56) References Cited

U.S. PATENT DOCUMENTS

| 5,210,650 A | * | 5/1993 | O'Brien et al. | ............. 359/820 |
| 5,313,333 A | * | 5/1994 | O'Brien et al. | ............. 359/820 |
| 5,504,828 A | * | 4/1996 | Cina et al. | ................... 385/33 |
| 5,570,238 A | * | 10/1996 | Leary | .......................... 359/820 |
| 6,040,950 A | * | 3/2000 | Broome | ...................... 359/820 |
| 6,120,191 A | * | 9/2000 | Asakura et al. | ................ 385/93 |
| 6,504,975 B1 | * | 1/2003 | Yamagata et al. | ............. 385/33 |
| 6,595,701 B1 | * | 7/2003 | Terada et al. | .................. 385/93 |

FOREIGN PATENT DOCUMENTS

| JP | H-04-320079 A | 11/1992 |
| JP | H-08-146352 A | 6/1996 |

\* cited by examiner

*Primary Examiner*—Minhloan Tran
*Assistant Examiner*—Eduardo A. Rodela
(74) *Attorney, Agent, or Firm*—Sughrue Mion, PLLC

(57) ABSTRACT

An optical semiconductor device having high precision of optical coupling and fabricated at low cost. The device comprises a semiconductor chip used as light source 3, lens system 6 constituted from one or more resin lenses for converging light output from the semiconductor chip used as light source 3, a conductive base 2 for mounting the semiconductor chip 3 thereon, and lens support assembly 4 and 5 for maintaining a predetermined distance from the semiconductor chip 3 and supporting the resin lens 6. Deviation from the image point of the lens system 6 caused by change of the refractive index of the lens system 6 due to change in temperature is compensated for by change in the distance between the semiconductor chip 3 and the lens system 6, caused by thermal expansion of the electrically conductive base 2 and the lens support assembly 4 and 5.

13 Claims, 3 Drawing Sheets

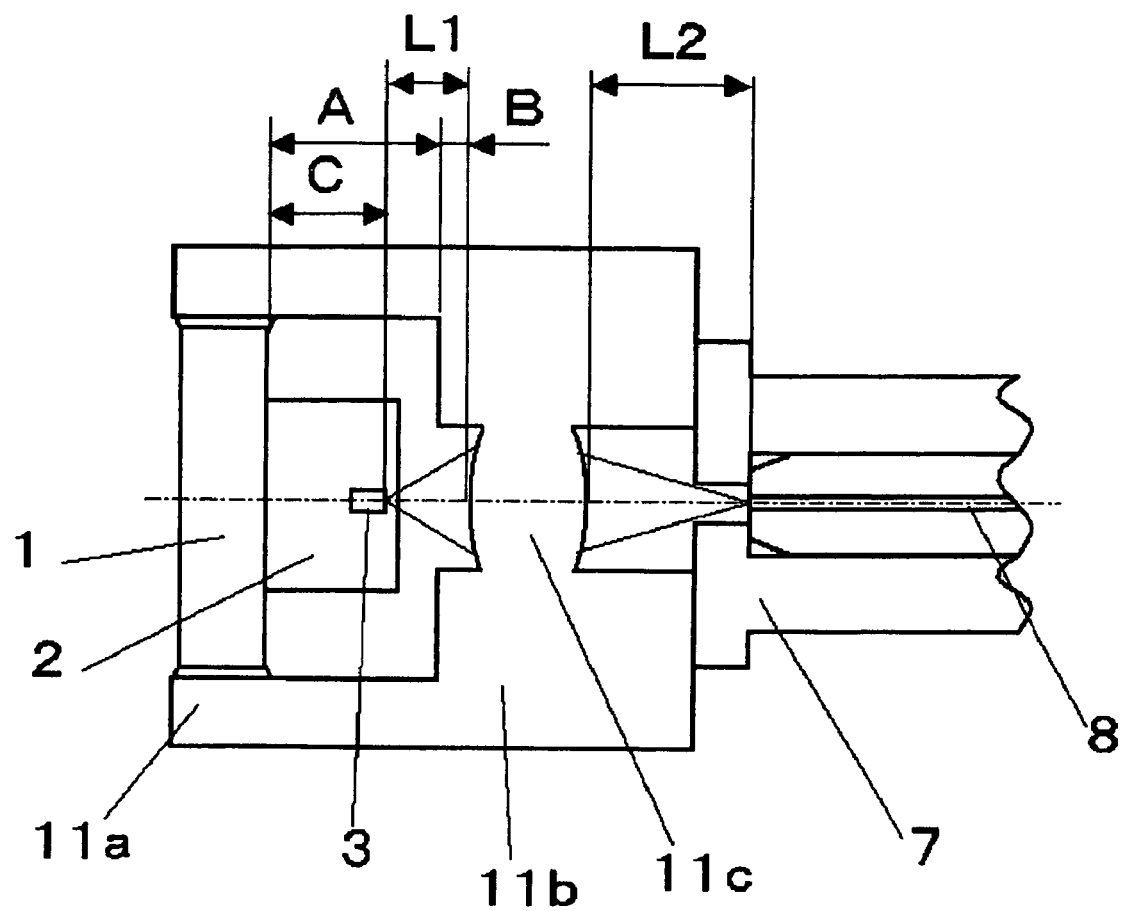

OPTICAL SEMICONDUCTOR DEVICE

FIELD OF THE INVENTION

The present invention relates to an optical semiconductor device. More specifically, the invention relates to an optical semiconductor device on which a plurality of optical components are mounted and optical coupling between the optical components is achieved.

BACKGROUND OF THE INVENTION

Conventionally, on optical semiconductor devices used for communications, a semiconductor laser as light source and a lens system are mounted, and an optical fiber is introduced from outside, for connection. Then, laser light modulated by a signal is rendered parallel by a collimator lens system or converged by a lens (system) for convergence, for outputting into the optical fiber.

Generally, the former uses two collimator lenses and is used for applications in which high precision in terms of the optical coupling is required, and the manufacturing cost of the former tends to be higher. For example, structures as described in Patent Documents 1 and 2 are known. The latter uses one lens for convergence, and is used for applications in which comparatively low precision in terms of the optical coupling suffices. The manufacturing cost of the latter can be low.

On the other hand, depending on whether the optical fiber connected to the optical semiconductor device is a multi-mode optical fiber which supports propagation of a plurality of modes or a single-mode optical fiber which supports propagation of only one mode, the precision of the optical coupling required for the optical semiconductor device differs. Generally, the higher precision of optical coupling is required in the optical semiconductor device connected to the single-mode optical fiber. Thus, this optical semiconductor device has higher performance, but its manufacturing cost tends to be higher.

[Patent Document 1]
  Japanese Patent Kokai Publication No. JP-A-4-320079

[Patent Document 2]
  Japanese Patent Kokai Publication No. JP-A-8-146352

SUMMARY OF THE DISCLOSURE

By the way, in recent years, due to the rapid spread of optical communications, high-performance and low-cost optical semiconductor devices have become necessary, regardless of whether they are for industrial or household use. Thus, in order to solve the problem as described above, it is desirable to obtain the precision level of the optical coupling required for the optical semiconductor device connected to the single-mode optical fiber, based on a structure of an optical semiconductor device to be connected to a multi-mode optical fiber. Further, it would be even more desirable to use a cheap resin lens for the convergence system and thereby obtain high precision of the optical coupling.

If an optical semiconductor device connected to the single-mode optical fiber is fabricated based on a structure of the optical semiconductor device connected to the multi-mode optical fiber, however, deviation from the image point of the lens is generated due to variations in the refractive index of the lens due to increase in temperature during operation. Thus, tracking errors resulting from reduction in optical output are generated. Especially when the resin lens is employed for the lens system, its generation becomes manifest.

The present invention has been made in view of the circumstances described above. It is therefore an object of the present invention is to provide an optical semiconductor device that has a high precision of optical coupling and can also be fabricated at low cost.

According to a first aspect of the present invention, there is provided an optical semiconductor device comprising a semiconductor chip used as light source; a lens system comprising one or more resin lenses for converging light output from the semiconductor chip used as light source;

an electrically conductive base for mounting the semiconductor chip used as light source thereon; and a lens support for supporting the lens system and maintaining a predetermined distance from the semiconductor chip used as light source mounted on the conductive base; wherein deviation from an image point caused by change of refractive index of the lens system due to change in temperature is compensated for by change of a distance between the semiconductor chip used as light source and the lens system, caused by thermal expansion of the electrically conductive base and the lens support.

According to a second aspect of the present invention, the lens support comprises a sleeve (or sleeves) for securing the conductive base and a lens holder for securing the lens system.

According to a third aspect of the present invention, among the sleeve, lens holder and lens system, the sleeve (or sleeves) and the lens holder (or holders) are integrally formed, the lens holder(s) and the lens system are integrally formed, or the sleeve(s), the lens holder(s) and the lens system are integrally formed.

According to a fourth aspect of the present invention, the sleeve(s), lens holder(s) and lens system are formed of the same kind of resin.

According to fifth aspect of the present invention, the semiconductor chip used as light source is a semiconductor laser. According to a further aspect of the present invention, an axial distance of the semiconductor chip to a reference plane and a thermal expansion coefficient of the mounting stem member and an axial length of the lens support member extending from the reference plane to the lens system and a thermal expansion coefficient of the lens support member are selected so as to compensate for deviation in the image point of the lens system due to change in temperature.

According to a still further aspect of the present invention, there is provided an optical semiconductor device comprising: a semiconductor light source disposed in an optical axis: a lens system for converging light emitted from the light source along the optical axis, the lens system being disposed at a predetermined distance from the semiconductor light source; and a mounting stem member for mounting the semiconductor light source on the optical axis directed toward the lens system. The device further comprises a lens support member for supporting the lens system on the optical axis and extending up to and securing the mounting stem member.

The axial distance of the light source to a reference plane defined by the mounting stem member and the lens support member and a thermal expansion coefficient of the mounting member, and an axial length and a thermal expansion coefficient of the lens support member are selected so as to compensate for deviation in the image point due to change in temperature of the device.

The deviation in the image point is caused by change in the refractive index of the lens system and the shift in the distance of the lens system from the light source due to the change in the temperature of the device.

The operation of the configuration described above will be described below.

In an optical semiconductor device comprising a semiconductor chip used as light source, a lens system formed of one or more resin lenses for converging light, an electrically conductive (termed as "conductive") base for mounting the semiconductor chip used as light source thereon, and a lens support(s) for supporting the lens system and maintaining a predetermined distance from the semiconductor chip used as light source mounted on the conductive base, as shown in FIG. 1, for example, the distance (axial, same hereinafter if not otherwise specified) from one (proximal) end of a connecting section between a stem base (conductive base) 1 for stem 2 and a sleeve (lens support) 4 to one end surface of a lens holder 5 is indicated by A, the distance from a vertex of one convex portion of a resin lens 6 to one end surface of the lens holder (lens support) 5 is indicated by B, and the distance from the connecting position between the base 1 and the sleeve 4 to an output end surface of a semiconductor laser (semiconductor chip used as light source) is indicated by C. Further, the coefficient of linear expansion of the sleeve 4 is indicated by $\alpha A$, the coefficient of linear expansion of the lens holder 5 is indicated by $\alpha B$, and the coefficient of linear expansion of the stem 2 as the semiconductor laser mounting unit (conductive base) is indicated by $\alpha C$. In addition, the refractive index of the lens at temperature T is indicated by n(T), and as shown in FIG. 2, the focal length of the lens is indicated by f(n(T)), the object-side principal point and the image-side principal point of the lens are indicated by h1(n(T)) and h2(n(T)), respectively, and the temperature change coefficient of the refractive index n(T) of the lens at a temperature T0 is indicated by ($\Delta n/\Delta T$). Then, by performing material selection and design of dimensions so as to satisfy the following equation:

$$\alpha A \cdot A + \alpha B \cdot B - \alpha C \cdot C \cong \quad (1)$$
$$\left[ \frac{\partial}{\partial n} \left( \frac{1}{\frac{1}{f(n(T))} - \frac{1}{L2 + h2(n(T))}} - h1(n(T)) \right) \right]_{T=T0} \left( \frac{\Delta n}{\Delta T} \right)$$

for example, a deviation from the image point of the lens system caused by the change of the refractive index of the lens system due to a change in temperature can be compensated for by a change in the distance between the semiconductor chip used as light source and the lens system, caused by thermal expansion of the conductive base and the lens support assembly.

The meritorious effects of the present invention are summarized as follows.

An optical semiconductor device of the present invention is configured to comprise a semiconductor chip used as light source, a lens system constituted from one or more resin lenses for converging light, a conductive base for mounting the semiconductor chip used as light source, and the lens support assembly for supporting the lens system and maintaining a predetermined distance from the semiconductor chip used as light source mounted on the conductive base. Then, a deviation from the image point of the lens system caused by the change of the refractive index of the lens system due to a change in temperature is compensated for by the change in the distance between the semiconductor chip used as light source and the lens system, caused by thermal expansion of the conductive base and the lens support assembly.

That is, precision of optical coupling required for the optical semiconductor device to be connected to a single-mode optical fiber can be obtained based on the structure of the optical semiconductor device to be connected to a multi-mode optical fiber. Further, high performance can be obtained based on the cheap resin lens for the convergence system. The optical semiconductor device therefore can achieve still lower cost while maintaining the high performance.

BRIEF DESCRIPTION OF THE DRAWINGS

FIG. 3 is a top plan view showing a configuration of an optical semiconductor device according to a second embodiment of the present invention.

PREFERRED EMBODIMENTS OF THE INVENTION

Embodiments of the present invention will be described below with reference to the drawings. The description will be specifically given using the embodiments.

First Embodiment

Figure 1:
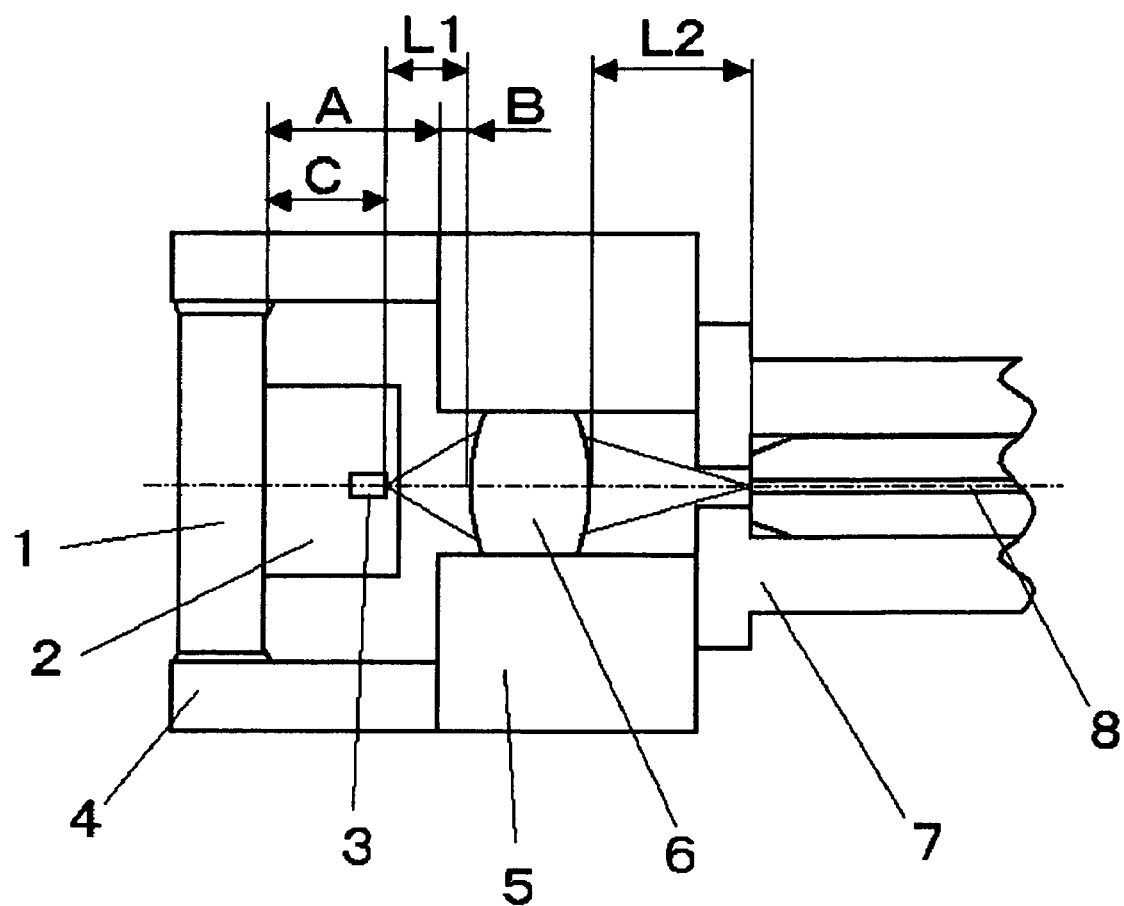
FIG. 1 is a top plan view showing a configuration of an optical semiconductor device according to a first embodiment of the present invention.

FIG. 1 is a top plan view showing a configuration of an optical semiconductor device according to a first embodiment of the present invention.

As shown in FIG. 1, this optical semiconductor device includes a semiconductor laser (a semiconductor chip used as light source) 3, one resin lens (a lens system) 6 for converging light output from the semiconductor laser 3, conductive stem assembly 1 and 2 for mounting the semiconductor laser 3 thereon, and lens support assembly 4 and 5 (formed of a sleeve 4 and a lens holder) for supporting the resin lens 6 and maintaining a predetermined distance from the semiconductor laser 3.

The resin lens 6 is formed by inserting a resin material into a die having a cavity of its shape for molding. As a material for the resin lens 6, liquid crystal polymer can be employed.

The stem assembly (or system) (1, 2) is constituted from a base 1 and a mounting member 2 for the semiconductor laser 3. Each of the base (flange) 1 and the mounting member (stem member) 2 for the semiconductor laser 3 is formed of a metal member mainly formed of Fe. The base 1 and the mounting member 2 for the semiconductor laser 3 are fabricated separately and then connected to each other by welding. Alternatively, they are integrally formed by etching a metal member into their shape from the beginning or by machining, e.g., cutting. The semiconductor laser 3 is jointed to the mounting member 2 with a solder e.g., made of a gold-tin alloy.

The lens support assembly 4 and 5 is constituted from the sleeve 4 for securing the base 2 and the lens holder 5 for securing the resin lens 6. The sleeve 4 and the lens holder 5 are formed of resins. In this embodiment, they are separately fabricated and connected to each other by an adhesive.

In the optical semiconductor device having such configuration, the light output from the semiconductor laser 3 (an object point) is converged by the resin lens 6, and an optical fiber 8 is connected to the position (image point) at which the light is converged, so that optical coupling between the optical semiconductor device and the optical fiber 8 is achieved. As the optical fiber 8, a single-mode optical fiber, for example, can be employed. Note, however, a multi-mode optical fiber can be also employed.

In this optical semiconductor device, as will be described below, a deviation from the image point caused by the change of the refractive index of the resin lens 6 due to a change in the temperature is compensated for by a change in the distance between the semiconductor laser 3 and the resin lens 6, caused by thermal expansion of the stem assembly 1 and 2 and the lens support assembly 4 and 5. Accordingly, it is necessary to perform material selection and design of dimensions so that the deviation from the image point may be sufficiently compensated for. Iron can be employed as the material of the stems 1 and 2, and the coefficient of linear expansion in the range of 8 to 13E–6/° C. can be selected for them. As the materials of the sleeve 4 and the lens holder 5, stainless steel or liquid polymer can be employed. In the case of stainless steel, the coefficient of linear expansion in the range of 12 to 20E–6/° C. can be selected, and in the case of liquid polymer, the coefficient of linear expansion in the range of 30 to 80E–6/° C. can be selected.

The principle underlying compensation for the image point deviation will be described below.

Figure 2:
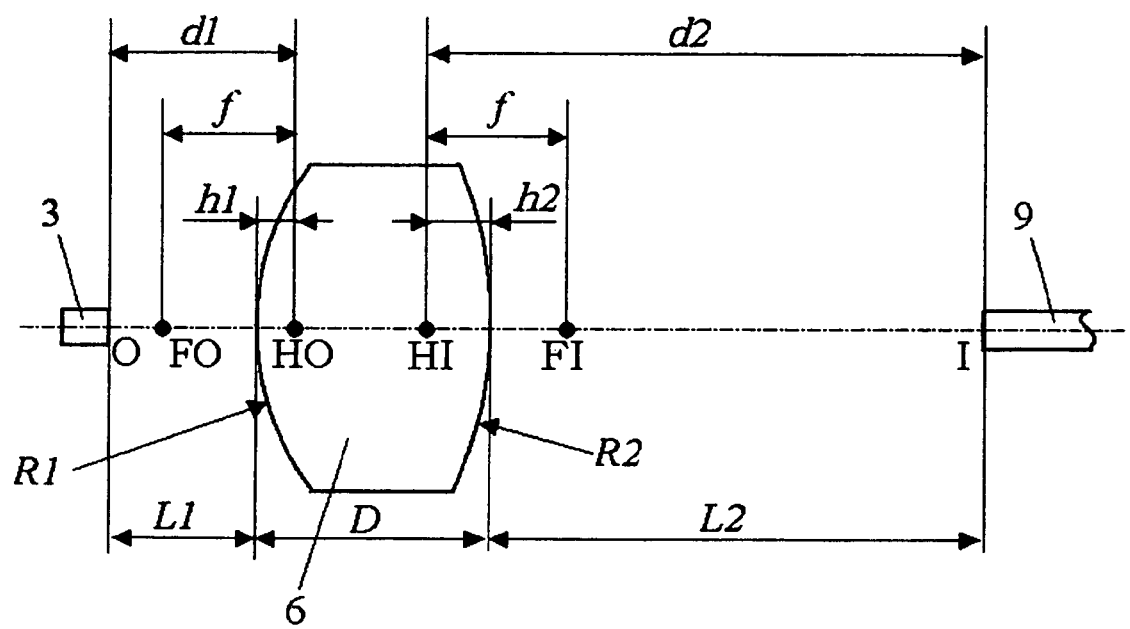
FIG. 2 is a diagram showing the relationship of optical coupling centering on a resin lens in FIG. 1.

First, as shown in FIG. 1, the distance from one (i.e., proximal) end of a connecting section between the base (flange) 1 for stem member and the sleeve 4 (i.e., a reference plane defined by the proximal end of the connection between the mounting stem member and the sleeve) to one end surface of a lens holder 5 is indicated by A, the distance from the vertex of one convex portion of the resin lens 6 to the one end surface of the lens holder 5 is indicated by B, and the distance from the one end of the connecting section between the base 1 and the stem 2 to the output end surface of the semiconductor laser is indicated by C. Further, the coefficient of linear expansion of the sleeve 4 is indicated by $\alpha A$, the coefficient of linear expansion of the lens holder 5 is indicated by $\alpha B$, and the coefficient of linear expansion of the stem 2 is indicated by $\alpha C$. In addition, as shown in FIG. 2, the focal length of the lens is indicated by f, the object-side principal point and the image-side principal point of the lens are indicated by h1 and h2, respectively, the refractive index of the lens at a temperature T is indicated by n(T), and the temperature change coefficient of the refractive index n(T) of the lens at a temperature T0 is indicated by $\Delta n/\Delta T$.

Incidentally, since the change in a distance L2 from the vertex of the other convex portion of the resin lens 6 to a portion connected to the optical fiber due to a change in temperature is sufficiently smaller than the change of a distance L1 from the output end surface of the semiconductor laser to the vertex of the one convex portion of the resin lens 6, the change of the distance L2 will be ignored in the following description.

The distance L1 from the output end surface of the semiconductor laser to the vertex of the one convex portion of the resin lens 6 is expressed by:

$$L1 = A + B - C \qquad (2)$$

Due to a change in the temperature of the housing of the device from T0 to T, expansion or contraction of the housing occurs, so that the size of the L1 changes. Assume that the change of the L1 due to the change in temperature is indicated by $\Delta L1\text{body}(T)$, the following equation:

$$\Delta L1\text{body}(T) = (\alpha A \cdot A + \alpha B \cdot B - \alpha C \cdot C) \cdot (T - T0) \qquad (3)$$

holds. That is, because of the change in temperature, the output end surface of the semiconductor laser is shifted just by $\Delta L1(T)$. Further, because of the change in temperature, the refractive index of the resin lens 6 changes. The positions of the principal points are thereby shifted.

When the temperature of the lens changes from T0 to T, a change of $\Delta L1\text{opt}(T)(=L1(T)-L1(T0))$ caused by the change in temperature, derived from the imaging formula in regard to the change in temperature, is expressed by:

$$\Delta L1opt(T) \cong \left[\frac{\partial}{\partial n}\left(\frac{1}{\frac{1}{f(n(T))} - \frac{1}{L2 + h2(n(T))}} - h1(n(T))\right)\right]_{T=T0} \left(\frac{\Delta n}{\Delta T}\right) \cdot (T - T0) \qquad (4)$$

Here, since Formula (4) can be easily derived from the well known imaging formula, the procedure therefor will be omitted. In this case, f(n(T)), h1(n(T)), and h2(n(T)) are functions of n(T).

It can be seen from the above description that, if the output end surface of the semiconductor laser is so shifted as to satisfy the equation of $\Delta L1\text{body}(T)=\Delta L1\text{opt}(T)$ in response to the thermal expansion and contraction of the housing, the imaging relationship before the temperature change can be maintained. That is, by satisfying the following formula derived from Formulas (3) and (4), $$\alpha A \cdot A + \alpha B \cdot B - \alpha C \cdot C \cong \left[\frac{\partial}{\partial n}\left(\frac{1}{\frac{1}{f(n(T))} - \frac{1}{L2 + h2(n(T))}} - h1(n(T))\right)\right]_{T=T0} \left(\frac{\Delta n}{\Delta T}\right) \qquad (5)$$

a deviation from the image point can be compensated for and a variation in optical output can be reduced, when the temperature changes from T0 to T.

As described above, according to the optical semiconductor device in the first embodiment of the present invention, high precision of optical coupling required for the optical semiconductor device connected to the single-mode optical fiber can be obtained, generally, based on such a structure that is used for the optical semiconductor device connected to a multi-mode optical fiber. Note, the optical semiconductor device used for connecting with the multi-mode optical fiber usually allows certain tolerance for the axial end position of the fiber relative to the converging lens system. Further, high performance can be obtained based on the cheap resin lens for the convergence system. The optical semiconductor device therefore can achieve still lower cost while maintaining the high performance.

Second Embodiment

FIG. 3 is a top plan view showing a configuration of an optical semiconductor device according to a second embodiment of the present invention.

The difference from the optical semiconductor device in the first embodiment is that a sleeve (lens support) 11a, a lens holder (lens support) 11b, and a lens system 11c constituted from one or more resin lenses are integrally formed. This single-piece structure can be formed by injecting a resin material into a die having a cavity of its corresponding shape for molding. Here, the components indicated by the same reference symbols as those in FIG. 1 represent the same components as in FIG. 1.

According to the optical semiconductor device in the second embodiment of the present invention, as in the optical semiconductor device in the first embodiment, high precision of the optical coupling required for the optical semiconductor device connected to the single-mode optical fiber can be obtained based on the structure of the optical semiconductor device connected to the multi-mode optical fiber. Further, high performance can be obtained based on the cheap resin lens for the convergence system. The optical semiconductor device can achieve still lower cost while maintaining the high performance.

The above description was given to the embodiments in detail with reference to the drawings. The specific configuration of the device is not limited to these embodiments, and any modifications to the design and the like within the gist of the present invention would also be included in the present invention.

In the above embodiments, for example, a description was directed to the case (first embodiment) where the sleeve 4, lens holder 5, and lens system 6 are separately formed and the case (second embodiment) where the sleeve 11a, lens holder 11b and lens system 11c are integrally formed, with respect to the sleeves 4 and 11a, lens holders 5 and 11b, and the lens systems 6 and 11c. A set of the sleeve 4 and the lens holder 5, or a set of the lens holder 5 and the lens system 6 may be integrally formed. In this case, the integrally formed components are formed of the same type of resin. Among the cases described above, in the case where the lens holder 5 is integrally formed with the lens system 6, the sleeve 4 may be at least formed of the same conductive material as with the stem base 1 for the stem, and may be integrally formed with the base 1 for the stem.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. An optical semiconductor device comprising:
    a semiconductor chip used as light source;
    a lens system comprising one or more resin lenses for converging light output from said semiconductor chip;
    an electrically conductive mounting stem member for mounting said semiconductor chip thereon;
    a lens support member for supporting said lens system and maintaining a predetermined distance from said semiconductor chip mounted on said electrically conductive mounting stem member; and
    wherein deviation from an image point caused by change of refractive index of said lens system due to change in temperature is compensated for by change of a distance between said semiconductor chip used as light source and said lens system, caused by a thermal expansion of said electrically conductive mounting stem and said lens support member.

2. The optical semiconductor device according to claim 1, further comprising an optical fiber receiving light condensed by said lens system so as to generate substantially no variation on the distance between said lens system and said optical fiber upon change in the temperature.

3. The optical semiconductor device according to claim 2, wherein said lens support member comprises a sleeve for securing said electrically conductive stem member and a lens holder for securing said lens system.

4. The optical semiconductor device according to claim 2, wherein among said sleeve, said lens holder and said lens system, said sleeve and said lens holder are integrally formed, said lens holder and said lens system are integrally formed, or said sleeve, said lens holder, and said lens system are integrally formed.

5. The optical semiconductor device according to claim 2, wherein said sleeve, said lens holder, and said lens system are formed of a same kind of resin.

6. The optical semiconductor device according to claim 2, wherein said semiconductor chip is a semiconductor laser.

7. The optical semiconductor device according to claim 2, wherein said lens system and said lens support member are formed of a same material.

8. The optical semiconductor device according to claim 2, wherein an axial distance of said semiconductor chip to a reference plane and a thermal expansion coefficient of said mounting stem member and an axial length of said lens support member extending from said reference plane to said lens system and a thermal expansion coefficient of said lens support member are selected so as to compensate for deviation in image point of the lens system due to change in temperature.

9. An optical semiconductor device comprising:
    a semiconductor light source disposed in an optical axis:
    a lens system for converging light emitted from said light source along said optical axis, said lens system being disposed at a predetermined distance from said semiconductor light source;
    a mounting stem member for mounting said semiconductor light source on said optical axis directed toward said lens system;
    a lens support member for supporting said lens system on said optical axis and extending up to and securing said mounting stem member; and
    wherein an axial distance of said light source to a reference plane defined by said mounting stem member and said lens support member and a thermal expansion coefficient of said mounting member, and an axial length and a thermal expansion coefficient of said lens support member are selected so as to compensate for deviation in image point due to change in temperature of the device.

10. The optical semiconductor device according to claim 9, wherein said lens supporting member comprises a cylindrical sleeve extending to and supporting said mounting stem member at said reference plane.

11. The optical semiconductor device according to claim 9, wherein said mounting stem member has a bottom flange portion secured by said lens supporting member at said reference plane.

12. The optical semiconductor device according to claim 9, wherein said deviation in the image point caused by change in refractive index of the lens system is compensated by a shift in the distance of said lens system for said light source due to the change in the temperature of the device.

13. The optical semiconductor device according to claim 9, further comprising an optical fiber receiving light condensed by said lens system so as to generate substantially no variation on the distance between said lens system and said optical fiber upon change in the temperature.

* * * * *